(12) United States Patent
Nippa et al.

(10) Patent No.: US 7,311,240 B2
(45) Date of Patent: Dec. 25, 2007

(54) ELECTRICAL CIRCUITS WITH BUTTON PLATED CONTACTS AND ASSEMBLY METHODS

(75) Inventors: Kinya Nippa, Sunnyvale, CA (US); Wei Hong Soh, Singapore (SG)

(73) Assignee: Finisar Corporation, Sunnyvale, CA (US)

( * ) Notice: Subject to any disclaimer, the term of this patent is extended or adjusted under 35 U.S.C. 154(b) by 11 days.

(21) Appl. No.: 10/836,129

(22) Filed: Apr. 30, 2004

(65) Prior Publication Data

US 2005/0242160 A1    Nov. 3, 2005

(51) Int. Cl.
    *B23K 31/02*   (2006.01)
(52) U.S. Cl. .................................... 228/180.1
(58) Field of Classification Search ............ None
    See application file for complete search history.

(56) References Cited

U.S. PATENT DOCUMENTS

| | | | |
|---|---|---|---|
| 3,271,214 | A | 9/1966 | Tabor |
| 3,987,676 | A | 10/1976 | Bennewitz |
| 4,011,980 | A * | 3/1977 | Dvorak et al. ........... 228/180.1 |
| 4,092,061 | A | 5/1978 | Stigliani, Jr. |
| 4,128,697 | A | 12/1978 | Simpson |
| 4,179,802 | A * | 12/1979 | Joshi et al. ................. 438/125 |
| 4,375,578 | A | 3/1983 | Mitchell et al. |
| 4,769,684 | A | 9/1988 | Crocker et al. |
| 4,818,099 | A | 4/1989 | Preikschat et al. |
| 4,952,016 | A | 8/1990 | Adams et al. |
| 4,953,006 | A | 8/1990 | Kovats |
| 4,962,991 | A | 10/1990 | Carvalho |
| 5,125,054 | A | 6/1992 | Ackley et al. |
| 5,136,682 | A | 8/1992 | Moyer et al. |
| 5,159,535 | A * | 10/1992 | Desai et al. ................ 361/751 |
| 5,212,345 | A | 5/1993 | Gutierrez |
| 5,249,245 | A | 9/1993 | Lebby et al. |
| 5,253,311 | A | 10/1993 | Killen et al. |
| 5,299,276 | A | 3/1994 | Okamura et al. |
| 5,359,686 | A | 10/1994 | Galloway et al. |
| 5,361,317 | A | 11/1994 | Hartman et al. |
| 5,371,820 | A | 12/1994 | Welbourn et al. |

(Continued)

FOREIGN PATENT DOCUMENTS

| | | |
|---|---|---|
| GB | 0 881 671 | 12/1998 |
| GB | 0 905 838 | 3/1999 |
| JP | 62-114545 | 5/1987 |
| JP | 03-148190 | 6/1991 |
| JP | 406034838 | 2/1994 |
| JP | 407159636 | 6/1995 |
| JP | 09-223848 | 8/1997 |
| JP | 2000228006 A * | 8/2000 |
| WO | 92/00538 | 1/1992 |

OTHER PUBLICATIONS

U.S. Appl. No. 10/409,837, filed Apr. 9, 2003, Kumar et al.

(Continued)

*Primary Examiner*—Jonathan Johnson
(74) *Attorney, Agent, or Firm*—Workman Nydegger (57) ABSTRACT

Exemplary methods for making a solder joint between two articles are disclosed. The method includes the steps of positioning a first article and a second article to be soldered together. At least one of the first article and the second article has at least one button attached to it. The button has a desired height above a surface of the article to which it is attached. The second article has a quantity of solder located in a position where the solder joint is to be formed. A heat source is applied until the quantity of solder liquefies. The heat source is removed until the solder solidifies with a uniform thickness approximately equal to the height of the button.

4 Claims, 5 Drawing Sheets

U.S. PATENT DOCUMENTS

| | | | |
|---|---|---|---|
| 5,371,822 A | 12/1994 | Horwitz et al. | |
| 5,375,184 A | 12/1994 | Sullivan | |
| 5,389,686 A | 2/1995 | Diop et al. | |
| 5,414,786 A | 5/1995 | Ohta et al. | |
| 5,420,954 A | 5/1995 | Swirhun et al. | |
| 5,432,630 A | 7/1995 | Lebby et al. | |
| 5,471,552 A | 11/1995 | Wuu et al. | |
| 5,495,125 A | 2/1996 | Uemura | |
| 5,499,312 A | 3/1996 | Hahn et al. | |
| 5,539,848 A | 7/1996 | Galloway | |
| 5,545,846 A | 8/1996 | Williams et al. | |
| 5,596,662 A | 1/1997 | Boscher | |
| 5,613,024 A | 3/1997 | Shahid | |
| 5,625,734 A | 4/1997 | Thomas et al. | |
| 5,638,469 A | 6/1997 | Feldman et al. | |
| 5,666,449 A | 9/1997 | Sawae et al. | |
| 5,703,895 A | 12/1997 | Ghirardi et al. | |
| 5,706,378 A | 1/1998 | Suzuki et al. | |
| 5,717,800 A | 2/1998 | Funabashi | |
| 5,774,614 A | 6/1998 | Gilliland et al. | |
| 5,788,143 A * | 8/1998 | Boyd et al. | 228/253 |
| 5,894,409 A | 4/1999 | Tanaka | |
| 5,974,214 A | 10/1999 | Shacklette et al. | |
| 6,011,695 A | 1/2000 | Dumke | |
| 6,040,624 A | 3/2000 | Chambers et al. | |
| 6,043,990 A * | 3/2000 | Johnson et al. | 361/803 |
| 6,045,269 A | 4/2000 | Watanabe et al. | |
| 6,069,991 A | 5/2000 | Hibbs-Brenner et al. | |
| 6,088,498 A | 7/2000 | Hibbs-Brenner et al. | |
| 6,091,475 A | 7/2000 | Ogino et al. | |
| 6,118,666 A | 9/2000 | Aoki et al. | |
| 6,195,261 B1 | 2/2001 | Babutzka et al. | |
| 6,268,231 B1 | 7/2001 | Wetzel | |
| 6,300,164 B1 * | 10/2001 | Call et al. | 438/108 |
| 6,326,553 B1 | 12/2001 | Yim et al. | |
| 6,380,493 B1 | 4/2002 | Morita et al. | |
| 6,404,960 B1 | 6/2002 | Hibbs-Brenner et al. | |
| 6,473,314 B1 | 10/2002 | Custer et al. | |
| 6,485,322 B1 | 11/2002 | Branch et al. | |
| 6,521,989 B2 | 2/2003 | Zhou | |
| 6,586,678 B1 | 7/2003 | Rosenberg et al. | |
| 6,617,518 B2 | 9/2003 | Ames et al. | |
| 6,700,079 B2 * | 3/2004 | Bogursky et al. | 174/268 |
| 6,703,561 B1 | 3/2004 | Rosenberg et al. | |
| 6,709,607 B2 | 3/2004 | Hibbs-Brenner et al. | |
| 6,800,169 B2 * | 10/2004 | Liu et al. | 156/292 |
| 2002/0170742 A1 | 11/2002 | Liaw et al. | |
| 2003/0102157 A1 | 6/2003 | Rosenberg et al. | |
| 2003/0197254 A1 | 10/2003 | Huang | |
| 2004/0018409 A1 | 1/2004 | Hui et al. | |
| 2004/0062491 A1 | 4/2004 | Sato et al. | |
| 2004/0090620 A1 | 5/2004 | Farr | |
| 2004/0092135 A1 | 5/2004 | Hofmesiter et al. | |

OTHER PUBLICATIONS

U.S. Appl. No. 10/835,832, filed Apr. 30, 2004, Kumar et al.
U.S. Appl. No. 10/836,728, filed Apr. 30, 2004, Ellison.
U.S. Appl. No. 11/094,990, filed Mar. 31, 2005, Liu et al.
U.S. Appl. No. 11/179,223, filed Jul. 11, 2005, Donald A. Ice.
U.S. Appl. No. 10/687,107, filed Oct. 16, 2003, Aronson et al.
Murata, S., Nishimura, K., *Improvement in Thermal Properties of a Multi-Beam Laser Diode Array*, Japanese Journal of Applied Physics, vol. 28, Suppl. 28-3, pp. 165-170 (1989).
Ali, "New Materials and Design Components for Integrated Optics," Technology Report/Fiberoptics, Laser Focus World, vol. 21, No. 8, Aug. 1985, Tulsa, U.S., pp. 48-50.
Cohen, "Passive Laser-Fiber Alignment by Index Method," IEEE Photonics Technology Letters, vol. 3, No. 11, Dec. 1991, pp. 985-987, New York, U.S.
Coldren, et al., "Flip-Chip Bonded, Back-Emitting, Microlensed Arrays of Monolithic Vertical Cavity Lasers and Resonant Photodetectors," Electronic Components and Technology Conference, Sep. 1999, pp. 733-740.
Havant, "Flexible Interposing Carrier Scheme for Optical Waveguides," Research Disclosure No. 303, Jul. 1989, p. 512.
Hibbs-Brenner, et al., "Packaging of VCSEL Arrays for Cost-Effective Interconnects at <10 Meters," Electronic Components and Technology Conference, Sep. 1999, pp. 747-752.
Hsu, et al., "Flip-chip Approach to Endfire Coupling Between Single-Mode Optical Fibres and Channel Waveguides," Patent Associates Literature, Electronic Letters, vol. 12, No. 16, pp. 404-405, Aug. 5, 1976.
Kazlas, et al., "Monolithic Vertical-Cavity Laser/p-i-n Photodiode Transceiver Array for Optical Interconnects," IEEE Photonics Technology Letters, Nov. 1998, pp. 1530-1532, vol. 10, No. 11.
Louderback, et al., "Flip Chip Bonded Arrays of Monolithically Integrated, Microlensed Vertical-Cavity Lasers and Resonant Photodetectors," IEEE Photonics Technology Letters, Mar. 1999, pp. 304-306, vol. II, No. 3.
Plawsky, et al., "Photochemically Machined, Glass Ceramic, Optical Fiber Interconnection Components," Article, Optoelectronic Materials, Devices, Packaging and Interconnects (1998), SPIE, vol. 994, pp. 101-106.
Sullivan, et al., "Polymeric Waveguides," 1992 IEEE, pp. 27-31.

* cited by examiner

ELECTRICAL CIRCUITS WITH BUTTON PLATED CONTACTS AND ASSEMBLY METHODS

CROSS-REFERENCE TO RELATED APPLICATIONS

Not applicable.

BACKGROUND OF THE INVENTION

1. The Field of the Invention

Exemplary embodiments of the present invention generally relate to the field of flexible circuits, and more particularly, to flexible circuits with button plated contacts.

2. The Relevant Technology

Transceiver modules come in a variety of shapes and sizes depending on the specific function they are designed to perform. For example, transceiver modules can be electronic, in which wires are connected to pass data signals, or optoelectronic, in which fiber optic cable is connected to pass data signals. Optoelectronic transceivers typically contain a transmitter optical sub-assembly (TOSA), a receiver optical sub-assembly (ROSA), and a printed circuit board (PCB) with various electrical circuits for controlling the TOSA and ROSA, and for connecting the transceiver module to external devices.

Providing an optimal connection between a TOSA and/or a ROSA and a PCB can be difficult. Within a transceiver module, the TOSA and the ROSA must be positioned within small tolerances to achieve the desired optical performance. Similarly, the PCB must be precisely positioned for its connections to adjacent devices, such as the module housing and external components that connect to the module. Adding a third layer of rigid alignment requirements (the PCB to the TOSA and/or ROSA) makes accurately positioning the devices difficult. In addition to problems with aligning the PCB with the TOSA and/or ROSA, the TOSA and the ROSA often experience vibration and movement as optical cables are moved, attached and detached. The PCB can be damaged or even cracked if it is rigidly attached to the TOSA and/or ROSA at one end and a transceiver module housing at the other. Furthermore, differential thermal contraction/expansion can also cause problems if the PCB is rigidly attached to the TOSA and/or ROSA and optionally to the transceiver module housing.

In an attempt to reduce the above problems, flexible circuits may be disposed between the TOSA and/or ROSA and the PCB to electrically interconnect them while isolating the PCB from vibration or thermal expansion or contraction. The flexible circuit is additionally advantageous in that, during production, the PCB may be mechanically fixed in place while the TOSA and/or ROSA are not, or vice versa. Therefore, a flexible circuit is frequently used for assembly of the module so that variations in device subassembly position do not prevent precise connections and alignments from being made between the TOSA and/or ROSA and the PCB.

In addition to the above, the TOSA and/or ROSA of a transceiver module may include a transistor-outline (TO) header to contain and protect the active devices within the TOSA and/or ROSA. The TO header in turn allows the electrical connection of the active devices in the TOSA and/or ROSA to the PCB, via a flexible circuit board or otherwise. With respect to their construction, TO headers often include a cylindrical metallic base with a number of conductive pins extending completely through, and generally perpendicular to, the base. One conventional method of conductively connecting a flexible circuit to a TO header includes pins on the TO header that connect to reinforced openings on one end of the flexible circuit, TO header pins are soldered to affix the flexible circuit and ensure reliable connections. In turn, the other end of the flexible circuit can attach to "finger" like traces on the rigid PCB, via soldering or otherwise. Such traces are typically aligned in a linear row along the edge of the PCB.

Figure 1:
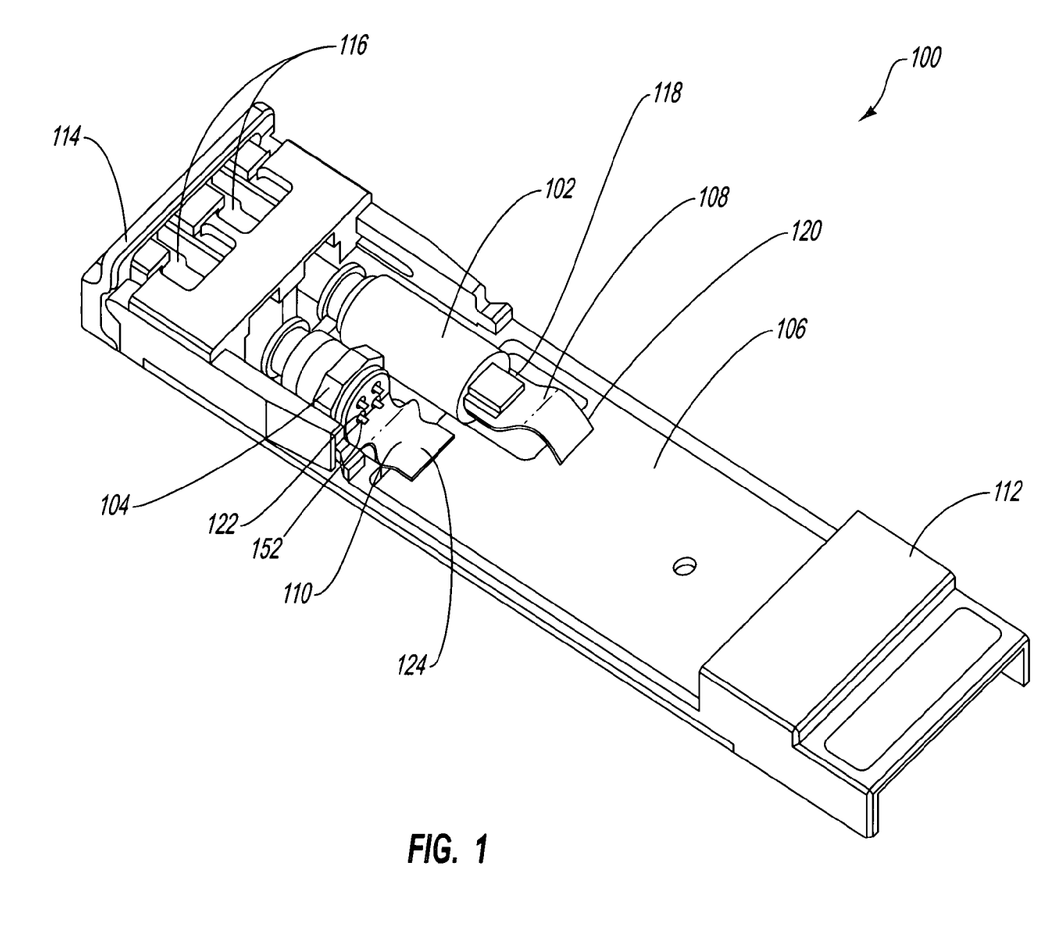
FIG. 1 illustrates a perspective view of a typical optoelectronic module with a printed circuit board.

The general construction of such an optoelectronic module 100 is shown in FIG. 1, which illustrates a perspective view of a transceiver module, designated generally at 100. More specifically, the depicted module can be an XFP transceiver module, which is a 10-Gigabit Small Form-Factor Pluggable Module for use in telecommunications networks, local area networks, metropolitan area networks, storage area networks, wide area networks, and the like. XFP transceivers are designed to occupy one-fifth of the space and use one-half the power of prior 10 Gb/s modules.

As depicted in FIG. 1, transceiver module 100 includes TOSA 102, ROSA 104, printed circuit board 106, first flexible circuit 108 and second flexible circuit 110. First flexible circuit 108 interconnects TOSA 102 and printed circuit board 106 while second flexible circuit 110 interconnects ROSA 104 and printed circuit board 106. Also depicted as part of module 100 are housing 112 for containing the electrical components of module 100. Cooperating with housing 112 are a bail release 114 that aids with removing module 100 from a patch panel or other structure that receives transceiver modules and Lucent Connector (LC) cable receptacles 116 for receiving and securely attaching LC cables to TOSA 102 and ROSA 104. In the illustrated embodiment of FIG. 1, first flexible circuit 108 connects to TOSA 102 at first interface 118 and connects to printed circuit board 106 at second interface 120. ROSA 104 attaches to second flexible circuit 110 at a third interface 122 via a TO-Header soldered pin interface. Second flexible circuit 110 connects to printed circuit board 106 at fourth interface 124.

One problem associated with the design shown in FIG. 1 is that the connections between flex circuit 108, PCB 106 and TOSA 102 can be difficult and time consuming to make. Likewise, the connections between flex circuit 110, PCB 106 and ROSA 104 can also be difficult and time consuming to make. In an attempt to speed up the process and reduce processing time, a "hot bar" process is used to connect, for example, flex circuit 108 to PCB 106.

Figure 2:
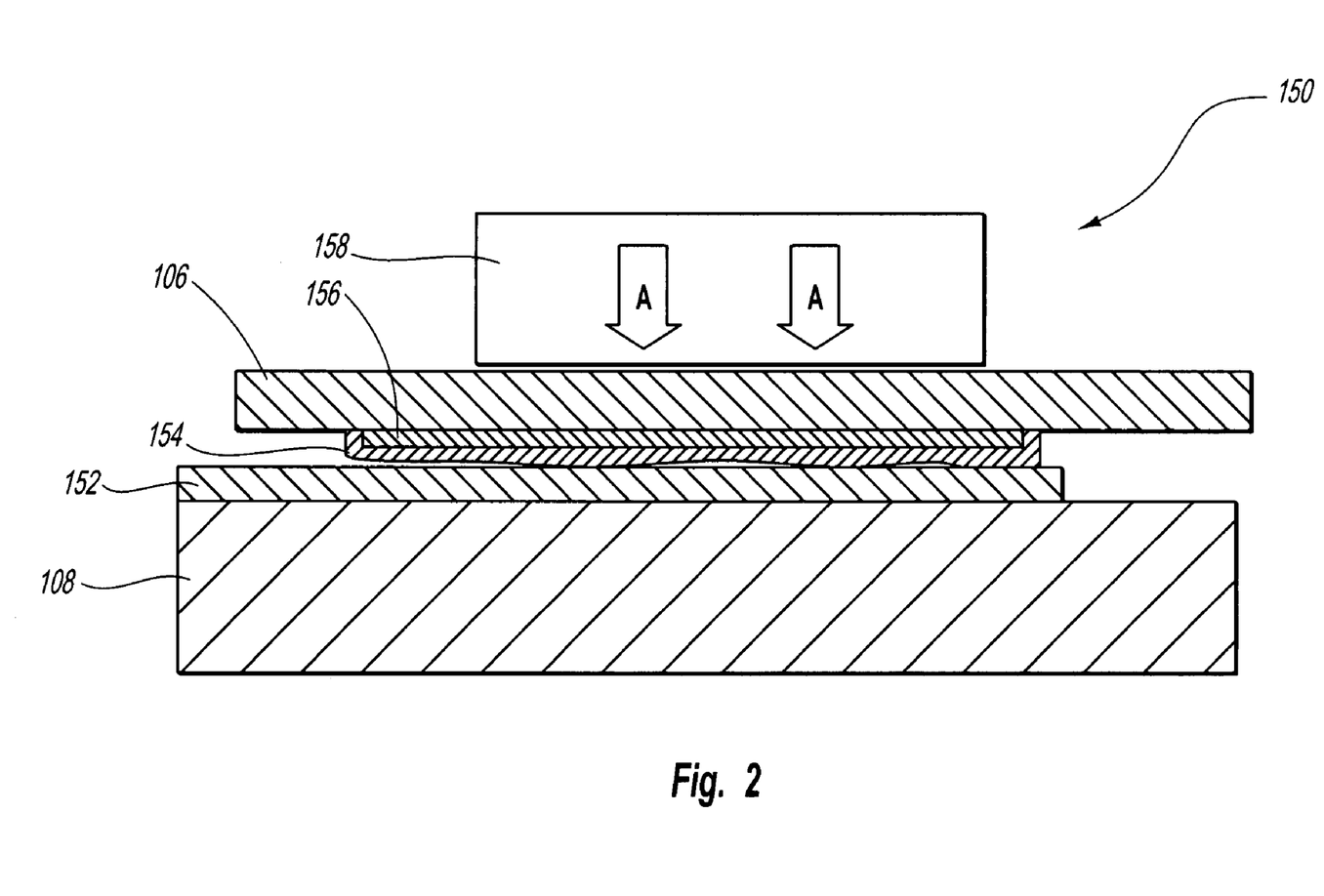
FIG. 2 illustrates a side view of a prior art hot bar soldering process.

With reference to FIG. 2, a conventional hot bar process can be used to attach, for example, PCB 106 to flexible circuit 108. One basic structure used to perform this process is shown in FIG. 2 as reference numeral 150. To perform the process, a pad 156 of PCB 106 is brought into close proximity with a corresponding pad 152 of flexible circuit 108. Pads 152 and 156 are shown as having a thickness for the purpose of illustration only. A layer of solder 154 is disposed between pads 152, 156. When a heat source 158 is applied to flexible circuit 106, as illustrated by arrows A, solder 154 liquefies and begins to flow.

Unfortunately, with process 150, the thickness of the solder joint thus formed varies depending on how much heat and pressure was applied. On parts of pad 152, the solder joint is relatively thick and on other parts it is relatively thin. This adversely affects the mechanical strength of the solder joint. In addition, this adversely affects the electrical transmission properties of the solder joint.

BRIEF SUMMARY OF THE EXEMPLARY EMBODIMENTS

What is needed is a method of making the solder connections between, for example, a flexible circuit and a printed circuit board that provides a uniform thickness of solder across the entire pad area. Embodiments of such a method are disclosed herein.

In an exemplary embodiment, the method includes a step for positioning first article and second articles to be soldered together. The second article can have at least one button attached to it, which has a desired height above a surface of the second article. Alternately, the button or buttons can be attached to the first article. Next a quantity of solder is placed between the first and second articles. Applying heat to the articles by way of heat source liquefies the solder. Upon removing heat source, the solder solidifies having a uniform thickness approximately equal to the height of the button. In alternate exemplary embodiments, the heat source can be pressed onto the first article.

The button can be made, by way of example and not limitation, from any metal capable of withstanding the heat supplied by the heat source without melting. Such metals can include copper, copper alloys, steel and other iron alloys, aluminum and aluminum alloys.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EXEMPLARY EMBODIMENTS

Figure 3:
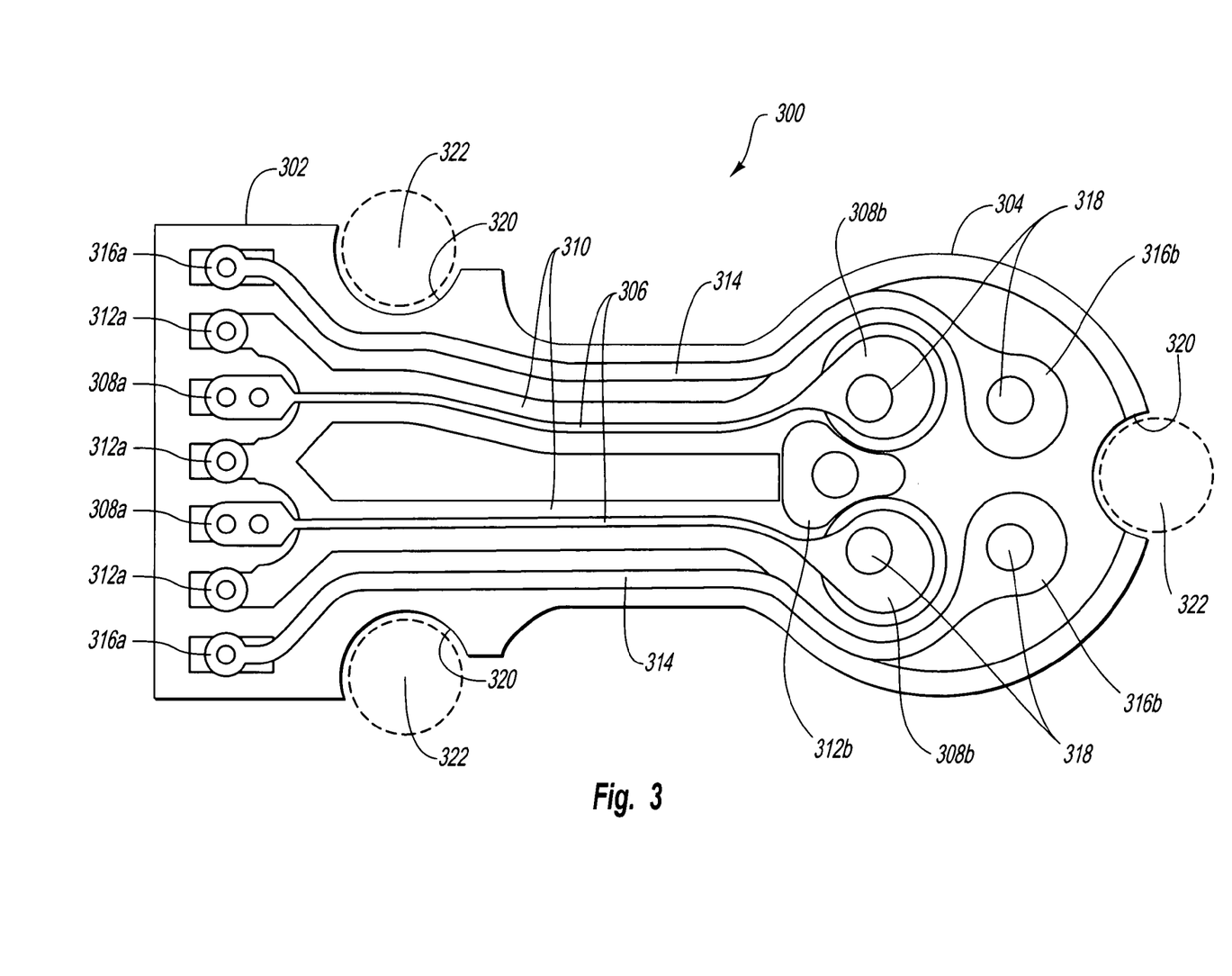
FIG. 3 illustrates one exemplary design for a flexible circuit.
Figure 4A:
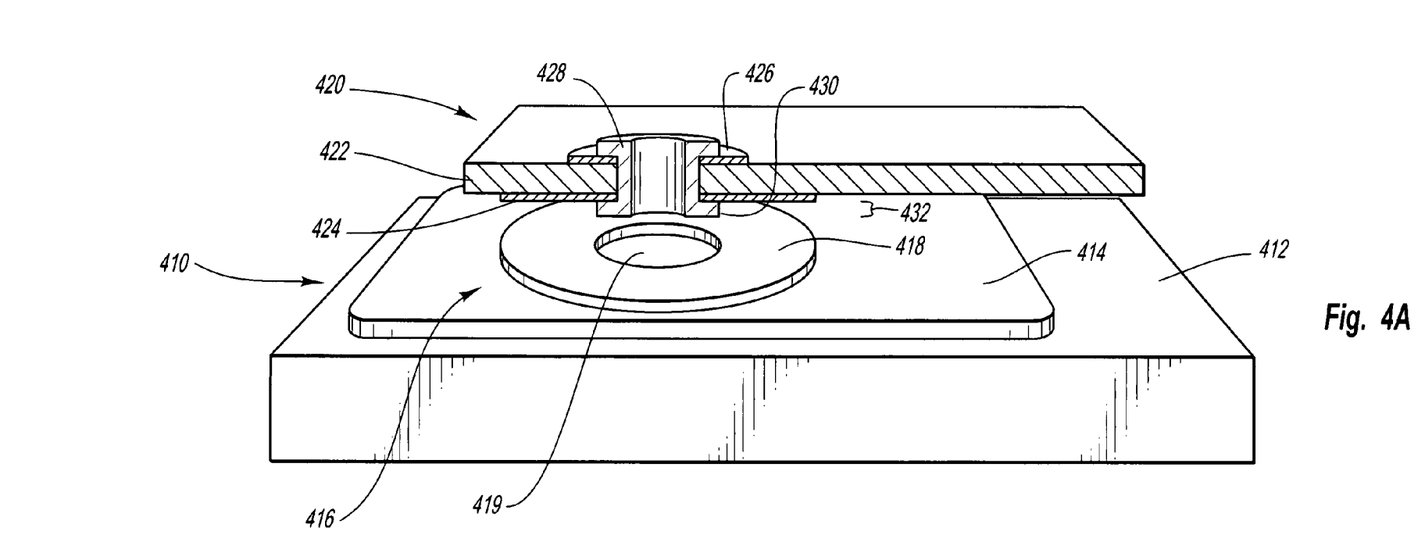
FIGS. 4A and 4B illustrate one exemplary embodiment of a soldering process utilizing plating buttons around through holes.
Figure 4B:
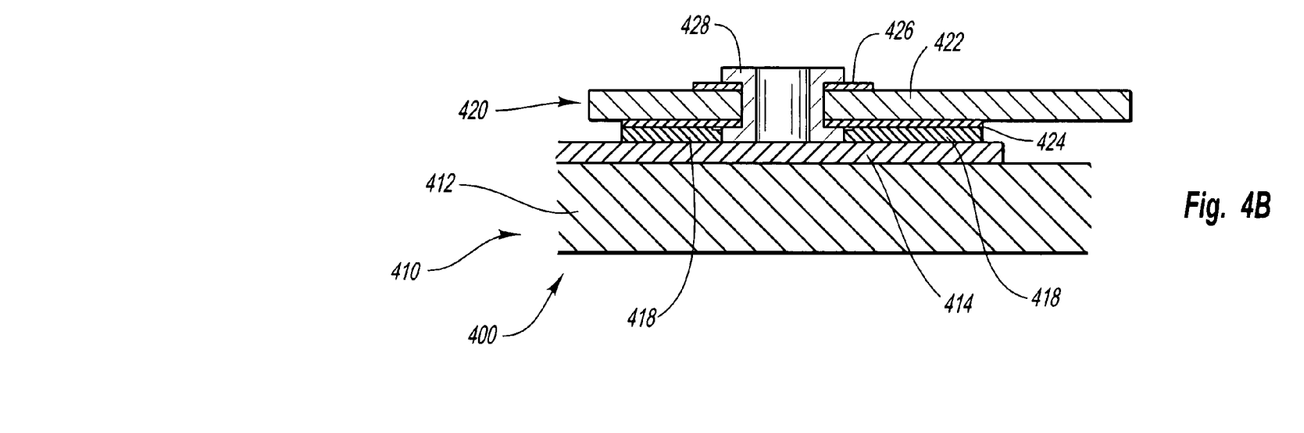
Figure 5A:
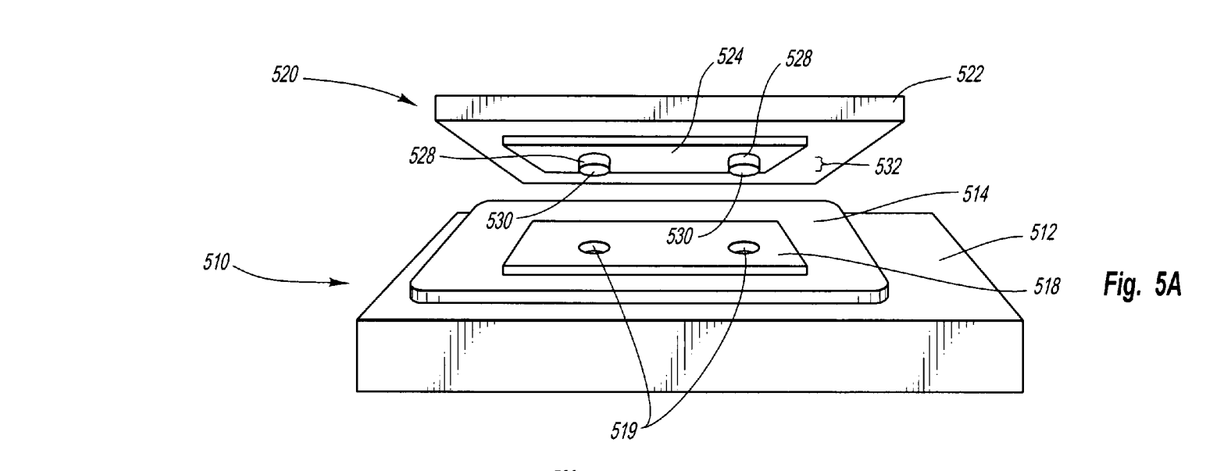
FIGS. 5A and 5B illustrates an alternate exemplary soldering process utilizing plating buttons.
Figure 5B:
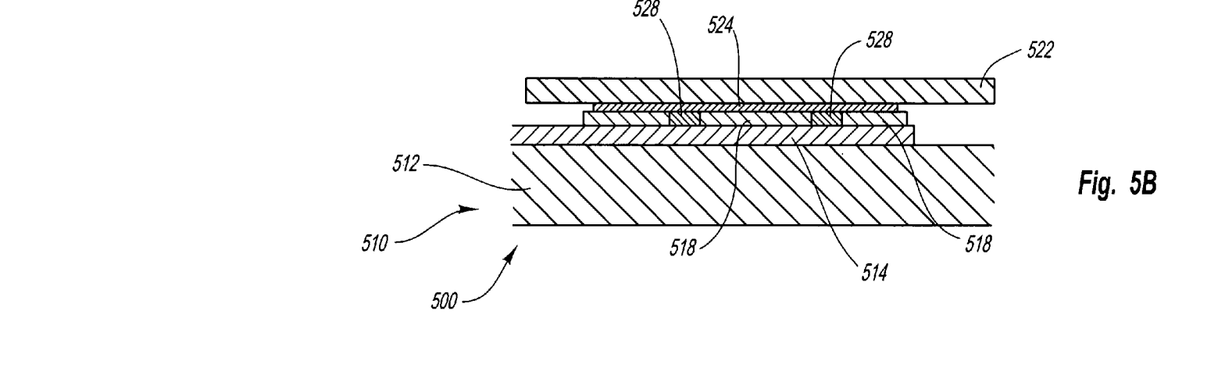

Reference will now be made to FIGS. 3-5, wherein like structures will be provided with like reference designations. It is understood that the Figures are diagrammatic and schematic representations of various embodiments of the claimed invention, and are not to be construed as limiting the scope of the present invention in any way, nor are they necessarily drawn to scale.

FIG. 3 illustrates one side of a flexible circuit 300. Flexible circuit 300 includes a first end 302 and another end 304. The end 302 can connect, for example, to PCB 106 (FIG. 1) at forth interface 124, while end 304 can connect to ROSA 104 at third interface 122. It will be understood that a similar discussion may be made with respect to a flexible circuit extending between PCB 106 (FIG. 1) and TDSA 102.

To aid with making the electrical connection between ROSA 104 and PCB 106 (FIG. 1), flexible circuit 300 includes high speed data traces 306, with associated high speed data pads 308a, 308b, and low speed data traces 314, with associated low speed data pads 316a, 316b. Additionally, flexible circuit 300 can include ground traces 310, with ground pads 312a, 312b, to provide an electrical ground for ROSA 104 and PCB 106 (FIG. 1).

In the illustrated configuration, pads 308a, 312a, 316a are in a substantially linear array at end 302 of flexible circuit 300. These pads 308a, 312a, and 316a provide the structures to facilitate electrical connection between PCB 106 (FIG. 1) and flexible circuit 300. Although a linear array is illustrated, one skilled in the art will understand of the possibility of a non-linear configuration of pads 308a, 312a, 316a. In one configuration, a soldering process completes the joining of flexible circuit 300 to ROSA 104 at interface 122 (FIG. 1). Solder fillets (not shown) can be formed in the areas where pads 308b, 312b, 316b substantially exceed the diameter of opening 318, since there are cover layer openings there. Optionally, ground trace 310 can be relieved around pads 308b, 312b, 316b to minimize parasitic capacitance, and thin high speed data trace 306 can be flared to prevent trace breakage. There can also be an integrated Kapton stiffening washer (not shown) bonded to end 304 of flexible circuit 300 to prevent flexing in the solder region and to thus prevent trace and solder joint breakage. Additionally, the techniques and methods of the present invention can be used to join end 304 to ROSA 104 (FIG. 1).

Disposed at end 304 of flexible circuit 300, which can connect to ROSA 104 (FIG. 1) in the illustrated configuration, openings 318 are formed for mating with conductive pins 152 (FIG. 1) on ROSA 104. Although traces 306, 310, and 314 and pads 308a, 308b, 312a, 312b, 316a, and 316b are illustrated mounted on flexible circuit 300, it is understood that many other types of electrical components can also be included on flexible circuit 300. For instance, other electrical components can include, but not limited to, resistors, capacitors, chips, dies, and other types of electrical components that can be used in any capacity in an electrical circuit.

Flexible circuit 300 can be a patterned arrangement of printed wiring utilizing flexible base material with or without flexible cover layers. In general, flexible circuits are produced in several basic forms that generally parallel printed circuit board constructions. These include, for example, single-sided flexible circuits, double-sided flexible circuits, multilayer flexible circuits (having three or more conductor layers), and rigid flexible circuits. Regarding multilayer flexible circuits, the layers of the circuit are interconnected with plated-through holes.

Flexible circuits can be manufactured using a variety of materials, such as polyimide, polyester, LCP, Teflon, and the like. Embodiments of the invention use a carefully selected material to form the core layer of the flexible circuit in order to accommodate the density of electrical traces and pads thereon. Such materials may include, by way of example only, DuPont Pyralux® AP-8525 and DuPont Kapton® E. For example, DuPont Pyralux® AP-8525 is a double-sided, copper-clad laminate and is an all-polyimide composite of polyimide film bonded to copper foil.

Additionally, flexible circuit 300 includes a plurality of tooling cutouts 320 that enable production machinery to hold and manipulate flexible circuit 300 using, for example, a plurality of guide pins 322 (shown in phantom), during manufacture of circuit 300 and during assembly of the transceiver module. Tooling cutouts 320 can be placed anywhere along the periphery of flexible circuit 300. The positions shown are by way of example only and should not be construed to limit the exemplary embodiments of the invention in any way.

FIGS. 4A and 4B illustrate one exemplary apparatus, designated generally as reference numeral 400, which facilitates the formation of a uniform solder joint between flexible circuit 300 (FIG. 3) and/or TOSA 102, ROSA 104 and/or PCB 106. Reference herein will be made generally to attachments of one article to another article. It will be understood that each "article" can be a PCB, flexible circuit, a portion of a ROSA or TOSA, or other electrical component or structure.

As illustrated, a first article 410 can include a substrate 412. In one exemplary embodiment, substrate 412 is a printed circuit board (PCB), although those skilled in the art will realize that article 410 can be any component that can have soldered joints. Substrate 412 can include a pad area 414 having a circular region 416. While pad area 414 is shown as having a thickness in FIG. 4B, this is for purposes of illustration only. Pad area 414 is generally that area that will receive a solder 418 when the solder joint is formed between first article 410 and a second article 422. Pad area 414 can, therefore, be planar with a surface of substrate 412 or article 410 may optionally be bounded by a marked outline on the surface of substrate 412.

Solder 418 can be automatically applied to pad area 414 during, by way of example and not limitation, the surface mount technology (SMT) phase of circuit preparation of substrate 412. By way of example and not limitation, solder 418 can be applied using generic solder paste printing and solder reflow tooling and processing techniques known to those of skill in the art. Other electrical components, traces and connections (not shown) can also be added to substrate 412 at this time. The quantity of solder 418 is chosen so as to be sufficient to provide for a solder joint of desired thickness and area, yet not so much that excess solder flow results in electrical shorts in joined articles 410, 420. Further, solder 418 includes a hole 419 that can receive a portion of article 420 or structures that facilitate formation of a uniformly thick solder joint between articles 410 and 420. Although hole 419 is depicted as being circular, one skilled in the art will understand that various other configurations are possible, such as, but not limited to, oval, curved, square, rectangular, polygonal, or other configurations that are complementary to the portion of article 420 and/or the structure facilitating formation of the desired solder joint.

Mountable to article 410 is second article 420 that can include a substrate 422. In an exemplary embodiment, substrate 422 is a flexible circuit, such as those described above with reference to FIG. 3. Those skilled in the art will realize that article 420 can be any component upon which soldered joints can form. Substrate 422 can have a pad area 424 that approximately corresponds to pad area 414. As with pad area 414, while pad area 424 is shown as having a thickness in FIG. 4B, this is for purposes of illustration only. Pad area 424 is generally that area that will receive a solder 418 when the solder joint is formed between first article 410 and second article 420. Pad area 424 can, therefore, be planar with a surface of substrate 422 or article 420 may optionally be bounded by a marked outline on the surface of substrate 422.

In this exemplary embodiment, substrate 422 can include a data or ground pad 426 (shown as a cross section through the middle of pad 426). This data or ground pad 426 can be similar to data and ground pads 308, 312 and 316 shown in FIG. 3. A button 428 can be located on or around a perimeter of pad 426. Button 428 has a lower surface 430. Button 428 protrudes below a lower surface of substrate 422 by a distance 432. While button 428 is shown as being attached to article 420, those skilled in the art will realize that button 428 could also be attached to article 410. In exemplary embodiments, button 428 can be made from various metals or metal alloys having a sufficiently high melting temperature to allow solder 418 to melt without melting button 428. Examples of such metals include copper, copper alloys, steel, aluminum, aluminum alloys, and other metals having sufficiently high melting points that are known to those of skill in the art.

To join article 410 and article 420 a heating process can be used. Initially, the process of joining article 410 and article 420 includes placing the articles in contact with each other as shown in FIG. 4B. More specifically, the process entails disposing button 428 through hole 419 in solder 418 until an end of button 428 is in close proximity to or contacting pad area 414 of substrate 412. A heat source (not shown) is applied that is capable of generating sufficient heat to melt solder 418.

This heat source is applied for a given temperature range and for a given time period. This time period and temperature are selected to liquefy the solder to form the joint but limit unwanted flow of solder generally beyond the bounds of pad area 414. The temperatures can be in the range of about 200° C. to about 240° C. and more specifically between about 210° C. to about 220° C. The amount of time that the heat is applied can range from about 2 to about 10 seconds and more specifically from about 6 to about 8 seconds. Since lower surface 430 of button 428 contacts pad 414 of substrate 412, the thickness of solder 418 corresponds to distance 432. This allows for a uniform thickness of solder 418 across the entire pad area 414, 424. The button 428 allows solder 418 to have a uniform thickness regardless of whether or not the heat source is applied with uniform pressure on the first article. This is a great improvement over previous processes.

Since button 428 allows solder 418 to have a uniform thickness, the specific dimensions of the heat source are no longer critical to the formation of the joint. Additionally, variations in pressure from front to rear or side to side as the heat source contacts article 410 will likewise have a minimal effect on the thickness of the solder joint. As long as a sufficient quantity of solder is placed on article 410, the joint thus formed will be relatively uniform. This also allows the thickness of the joint to be precisely controlled, thus providing for increased and uniform mechanical bond strength between the articles. For example, in laboratory tests, the thickness of the solder joint can be controlled to within about 4 ten thousandths of an inch (0.4 mil). With a given solder type, this provides the additional advantage of controlling the electrical conductivity of the solder joint, much as the electrical conductivity of traces on a flexible circuit is controlled by adjusting the width of the trace. Furthermore, as a result of this precise control of solder thickness and a corresponding reduction in solder overflow, the space between pads on the flexible circuit can be smaller than with previous processes. By way of example and not limitation, the distance between pads 316a and 312a in FIG. 3 can be reduced using this exemplary embodiment.

FIGS. 5A and 5B illustrate an alternate exemplary apparatus, designated generally as reference numeral 500, which facilitates the formation of a uniform solder joint between a flexible circuit and/or TOSA 102, ROSA 104 and/or PCB 106. Reference herein will be made generally to attachments of one article to another article. It will be understood that each "article" can be a PCB, flexible circuit, a portion of a ROSA or TOSA, or other electrical component or structure.

As illustrated, first article 510 can include a substrate 512. In one exemplary embodiment, substrate 512 is a printed circuit board (PCB), although those skilled in the art will realize that article 510 can be any component that can have soldered joints. Substrate 512 can include a pad area 514. While pad area 514 is shown as having a thickness in FIGS. 5A and 5B, this is for purposes of illustration only. Pad area 514 is generally that area that will receive a solder 518 when the solder joint is formed between articles 510, 520. Pad area can, therefore, be planar with a surface of substrate 512 or article 510 can optionally be bounded by a marked outline on the surface of substrate 512.

Solder 518 can be automatically applied to pad area 514 during, by way of example and not limitation, the surface mount technology (SMT) phase of circuit preparation of substrate 512. By way of example and not limitation, solder 518 can be applied using generic solder paste printing and solder reflow tooling and processing techniques known to those of skill in the art. Other electrical components, traces and connections (not shown) can also be added to substrate 512 at this time. The quantity of solder 518 is chosen so as to be sufficient to provide for a solder joint of desired thickness and area, yet not so much that excess solder flow results in electrical shorts in joined articles 510, 520. Further, solder 518 can include a hole 519 that can receive a portion of article 520 or structures that facilitate formation of a uniformly thick solder joint between articles 510 and 520. Although hole 519 is depicted as being circular, one skilled in the art will understand that various other configurations are possible, such as, but not limited to, oval, curved, square, rectangular, polygonal, or other configurations that are complementary to the portion of article 520 and/or the structure facilitating formation of the desired solder joint.

Mountable to article 510 is article 520 that can include a substrate 522. In an exemplary embodiment, substrate 522 is a flexible circuit, such as those described above with reference to FIG. 3. However, those skilled in the art will realize that that article 520 can be any component that can have soldered joints. Substrate 522 can have a pad area 524 that approximately corresponds to pad area 514. As with pad area 514, while pad area 524 is shown as having a thickness, this need not be the case. Pad area 524 can be an area or outline marked on a surface of substrate 522.

In this exemplary embodiment, substrate 522 includes a plurality of buttons 528, each having a lower surface 530. Button 528 protrudes below a lower surface of substrate 522 by a distance 532. While button 528 is shown as being attached to article 520, those skilled in the art will realize that button 528 could also be attached to article 510. In exemplary embodiments, button 528 can be made from various metals or metal alloys having a sufficiently high melting temperature to allow solder 518 to melt without melting button 528. Examples of such metals include copper, copper alloys, steel, aluminum, aluminum alloys, and other metals having sufficiently high melting points that are known to those of skill in the art.

To join article 510 and article 520 a heating process can be used. Initially, the process of joining article 510 and article 520 includes placing the articles in contact with each other as shown in FIG. 5B. More specifically, the process entails disposing button 528 through hole 519 in solder 518 until an end of button 528 is in close proximity to or contacting pad area 514 of substrate 512. A heat source (not shown) is applied that is capable of generating sufficient heat to melt solder 518.

This heat source is applied in a given temperature range and for a given period of time. This time period and temperature are selected to liquefy the solder to form the joint but limit unwanted flow of solder generally beyond the bounds of pad area 514. The temperatures can be in the range of about 200° C. to about 240° C. and more specifically between about 210° C. to about 220° C. The amount of time that the heat is applied can range from about 2 to about 10 seconds and more specifically from about 6 to about 8 seconds. Since lower surface 530 of button 528 contacts pad 514 of substrate 512, the thickness of solder 518 corresponds to distance 532. This allows for a uniform thickness of solder 518 across the entire pad area 514, 524. The button 528 allows solder 518 to have uniform thickness regardless of whether or not the hear source is applied with uniform pressure on the first article. Those skilled in the art will realize that a sufficient number of buttons 528 should be employed to ensure a uniform solder thickness across the entire solder area.

Since button(s) 528 allow solder 518 to have a uniform thickness, the specific dimensions of the heat source are no longer critical to the formation of the joint. Additionally, variations in pressure from front to rear or side to side as the heat source contacts article 510 will likewise have a minimal effect on the thickness of the solder joint. As long as a sufficient quantity of solder is placed on article 510, the joint thus formed will be relatively uniform. This also allows the thickness of the joint to be precisely controlled, thus providing for increased and uniform mechanical bond strength between the articles. For example, as with the embodiment shown in FIGS. 4A and 4B, the thickness of the solder joint can be controlled to within about 4 ten thousandths of an inch (0.4 mil). With a given solder type, this provides the additional advantage of controlling the electrical conductivity of the solder joint, much as the electrical conductivity of traces on a flexible circuit is controlled by adjusting the width of the trace.

The exemplary processes shown in FIGS. 4A, 4B, 5A and 5B provide several advantages over previous processes. First, the solder joint is uniform in thickness. The buttons greatly reduce the sensitivity to pressure, temperature and shape of the heat source found in the previous processes. In particular, the buttons allow for a uniform solder thickness regardless of how much pressure is applied by the heat source on the first article, or where that pressure is applied. Second, the corresponding solder joint is therefore stronger and able to resist mechanical stresses much more effectively.

Additionally, the thickness of the solder joint can be controlled with relative precision. For example, in laboratory tests, the thickness of the solder joint can be controlled to within about 4 ten thousandths of an inch (0.4 mil). With a given solder type, this provides the additional advantage of controlling the electrical conductivity of the solder joint, much as the electrical conductivity of traces on a flexible circuit is controlled by adjusting the width of the trace.

Furthermore, as a result of this precise control of solder thickness and a corresponding reduction in solder overflow, the space between pads on the flexible circuit can be smaller than with previous processes. By way of example and not limitation, the distance between pads 316a and 312a in FIG. 3 can be reduced using the exemplary embodiments discussed above.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for electrically inter-connecting an optical subassembly with a printed circuit board via a flexible circuit board that can be disposed within the housing of an optical transceiver module, the method comprising the steps of:

electrically connecting a first end of a flexible circuit board to a printed circuit board, the electrical connection comprising the steps of:

(a) placing a quantity of solder on a pad region disposed on a top surface of the printed circuit board;

(b) placing a button extending a predetermined distance from a surface of the flexible circuit board at the first end within a hole formed in the solder, such that a lower surface of the button contacts the pad of the of the printed circuit board;

(c) applying a heat source and heating at least one of said flexible circuit and said printed circuit board until said quantity of solder liquefies;

(d) removing said heat source until said solder solidifies, said solder having a uniform thickness approximately equal to the predetermined distance; and electrically connecting a second end of a flexible circuit board to an optical subassembly, the electrical connection comprising the steps of:

(e) repeating steps (a)-(d) at the second end of the flexible circuit board to electrically connect it to the optical subassembly.

2. The method of claim 1, further comprising a step for using said heat source to apply pressure to said flexible circuit and said printed circuit board or said optical subassembly when applying said heat source.

3. The method of claim 1, wherein said button comprises any one of copper, a copper alloy, steel, aluminum, and an aluminum alloy.

4. The method of claim 1, wherein the placing step comprises placing a plurality of buttons.

* * * * *

UNITED STATES PATENT AND TRADEMARK OFFICE
CERTIFICATE OF CORRECTION

PATENT NO. : 7,311,240 B2 Page 1 of 1
APPLICATION NO. : 10/836129
DATED : December 25, 2007
INVENTOR(S) : Nippa et al.

It is certified that error appears in the above-identified patent and that said Letters Patent is hereby corrected as shown below:

Title Page item 56
U.S. Patent Documents, change the inventor of patent 4,953,006 from "Kovats" to --Kovats et al.--

Column 3
Line 64, change "forth" to --fourth--
Line 67, change "TDSA" to --TOSA--

Column 4
Line 14, after "understand" omit "of"

Column 7
Line 11, after "Pad area" insert --514--
Line 12, after "512" insert --,--
Line 40, omit first instance of "that" wherein text reads "that that article"

Column 8
Line 15, change "hear" to --heat--

Column 9
Lines 18-19, omit first instance of "of the" wherein text reads "of the of the printed"

Signed and Sealed this

Sixth Day of July, 2010

David J. Kappos
*Director of the United States Patent and Trademark Office*